(12) United States Patent
Taniguchi

(10) Patent No.: US 11,201,599 B2
(45) Date of Patent: Dec. 14, 2021

(54) BAND PASS FILTER

(71) Applicant: Murata Manufacturing Co., Ltd., Nagaokakyo (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/144,190

(22) Filed: Jan. 8, 2021

(65) Prior Publication Data

US 2021/0126609 A1    Apr. 29, 2021

Related U.S. Application Data

(63) Continuation of application No. PCT/JP2019/030203, filed on Aug. 1, 2019.

(30) Foreign Application Priority Data

Aug. 10, 2018  (JP) .............................. JP2018-152042

(51) Int. Cl.
  *H03H 7/01* (2006.01)
  *H03H 7/09* (2006.01)
  *H01F 27/28* (2006.01)
  *H03H 1/00* (2006.01)

(52) U.S. Cl.
  CPC ....... *H03H 7/0115* (2013.01); *H01F 27/2804* (2013.01); *H03H 7/0161* (2013.01); *H03H 7/09* (2013.01); *H01F 2027/2809* (2013.01); *H03H 2001/0085* (2013.01)

(58) Field of Classification Search
  CPC . H03H 7/0115; H03H 2001/0085; H03H 7/09
  USPC .......................................... 333/167, 175, 185
  See application file for complete search history.

(56) References Cited

U.S. PATENT DOCUMENTS

| | | | | |
|---|---|---|---|---|
| 3,718,874 A | * | 2/1973 | Cooper, Jr. | .......... H03H 7/0161 333/204 |
| 9,722,567 B2 | * | 8/2017 | Yunoki | ............... H03H 7/0161 |
| 2013/0229241 A1 | | 9/2013 | Imamura | |
| 2014/0077895 A1 | | 3/2014 | Imamura | |
| 2016/0218690 A1 | | 7/2016 | Imamura | |

FOREIGN PATENT DOCUMENTS

| | | |
|---|---|---|
| JP | 2014-057277 A | 3/2014 |
| JP | 2016-139873 A | 8/2016 |
| WO | 2011/065270 A1 | 6/2011 |
| WO | 2012/077498 A1 | 6/2012 |

OTHER PUBLICATIONS

Official Communication issued in International Patent Application No. PCT/JP2019/030203 dated Oct. 21, 2019.

* cited by examiner

*Primary Examiner* — Rakesh B Patel
(74) *Attorney, Agent, or Firm* — Keating & Bennett, LLP

(57) ABSTRACT

A band pass filter includes a first filter circuit, a second filter circuit, a first intermediate circuit, a second intermediate circuit, and a ninth capacitor. The first intermediate circuit includes a seventh inductor connected between a fifth capacitor and a sixth capacitor. The second intermediate circuit includes an eighth inductor connected between a seventh capacitor and an eighth capacitor. The ninth capacitor is connected between the first intermediate circuit and the second intermediate circuit.

15 Claims, 14 Drawing Sheets

FILTER CHARACTERISTIC DIAGRAM
OF BAND PASS FILTER 100A

FILTER CHARACTERISTIC DIAGRAM
OF BAND PASS FILTER 100C

BAND PASS FILTER

CROSS REFERENCE TO RELATED APPLICATIONS

This application claims the benefit of priority to Japanese Patent Application No. 2018-152042 filed on Aug. 10, 2018 and is a Continuation Application of PCT Application No. PCT/JP2019/030203 filed on Aug. 1, 2019. The entire contents of each application are hereby incorporated herein by reference.

BACKGROUND OF THE INVENTION

1. Field of the Invention

The present invention relates to a band pass filter, and particularly, to a band pass filter including a plurality of resonant circuits including inductors and capacitors.

2. Description of the Related Art

A high-frequency band pass filter suitable for miniaturization and cost reduction is configured by forming a plurality of resonant circuits including capacitors and inductors in a laminate including dielectric layers, pattern conductors, and via conductors. An example of such a band pass filter, is described in Japanese Patent Application Laid-Open No. 2014-57277.

The band pass filter of Japanese Patent Application Laid-Open No. 2014-57277 includes three or more resonant circuits formed of inductor and capacitors, and a floating conductor arranged so as to straddle the respective inductors without contacting other line conductors. Then, electrostatic capacitance formed by the floating conductor and a predetermined line conductor is made larger than the sum of resonant capacitances which define the capacitors.

In the band pass filter, maintaining a pass band and changing an amount of attenuation of an attenuation pole may sometimes be required at the same time. Here, in the band pass filter of Japanese Patent Application Laid-Open No. 2014-57277, with the above configuration, a desired pass band is obtained while capacitively coupling non-adjacent resonant circuits. In that case, if the pass band is changed, the amount of attenuation of the attenuation pole may sometimes fluctuate accordingly. That is, it may be difficult to change the amount of attenuation of the attenuation pole while maintaining the pass band.

SUMMARY OF THE INVENTION

Preferred embodiments of the present invention provide band pass filters that are each capable of generating an attenuation pole with a required amount of attenuation on at least one of a high frequency side and a low frequency side of a pass band while maintaining the pass band. In the band pass filters according to preferred embodiments of the present invention, a coupling structure of a plurality of resonant circuits can be improved.

A band pass filter according to a first preferred embodiment of the present invention includes a first filter circuit, a second filter circuit, a first intermediate circuit, a second intermediate circuit, and a ninth capacitor. The first filter circuit includes a first resonant circuit and a second resonant circuit. The first resonant circuit includes a first inductor, a third inductor, and a first capacitor. The second resonant circuit includes a second inductor, a third inductor, and a second capacitor. The second filter circuit includes a third resonant circuit and a fourth resonant circuit. The third resonant circuit includes a fourth inductor, a sixth inductor, and a third capacitor. The fourth resonant circuit includes a fifth inductor, a sixth inductor, and a fourth capacitor. The first intermediate circuit includes a fifth capacitor connected to ground, a sixth capacitor connected to the ground, and a seventh inductor connected between the fifth capacitor and the sixth capacitor. The second intermediate circuit includes a seventh capacitor connected to the ground, an eighth capacitor connected to the ground, and an eighth inductor connected between the seventh capacitor and the eighth capacitor. The seventh inductor is electromagnetically coupled to each of the first to third inductors. The eighth inductor is electromagnetically coupled to each of the fourth to seventh inductors. The ninth capacitor is connected between the first intermediate circuit and the second intermediate circuit.

A band pass filter according to a second preferred embodiment of the present invention includes a plurality of laminated dielectric layers, a first filter circuit and a second filter circuit, a first intermediate circuit and a second intermediate circuit, and a first intermediate capacitor electrode. The first filter circuit and the second filter circuit are positioned side by side in a direction perpendicular or substantially perpendicular to a lamination direction of the plurality of dielectric layers. The first intermediate circuit and the second intermediate circuit are positioned side by side between the first filter circuit and the second filter circuit. The first intermediate circuit is electromagnetically coupled to the first filter circuit. The second intermediate circuit is electromagnetically coupled to each of the second filter circuit and the first intermediate circuit. Each of the first filter circuit and the second filter circuit includes a first line electrode, a first ground electrode, a first capacitor electrode, a second capacitor electrode, a first via conductor, a second via conductor, and a ground via conductor. The first line electrode extends in a direction perpendicular or substantially perpendicular to a lamination direction of the dielectric layers. The first capacitor electrode and the second capacitor electrode face the first ground electrode. The first via conductor passes in the lamination direction and connects the first line electrode and the first capacitor electrode to each other. The second via conductor passes in the lamination direction and connects the first line electrode and the second capacitor electrode to each other. The ground via conductor is between the first via conductor and the second via conductor, passes in the lamination direction, and connects the first line electrode and the first ground electrode to each other. Each of the first intermediate circuit and the second intermediate circuit includes a second ground electrode, a third capacitor electrode, a fourth capacitor electrode, a second line electrode, a third via conductor, and a fourth via conductor. The second line electrode extends in a direction perpendicular or substantially perpendicular to the lamination direction of the dielectric layers. The third capacitor electrode and the fourth capacitor electrode face the second ground electrode. The third via conductor passes in the lamination direction and connects the second line electrode and the third capacitor electrode to each other. The fourth via conductor passes in the lamination direction and connects the second line electrode and the fourth capacitor electrode to each other. The first intermediate capacitor electrode faces the third capacitor electrode of the first intermediate circuit and the third capacitor electrode of the second intermediate circuit.

A band pass filter according to a third preferred embodiment of the present invention includes a plurality of laminated dielectric layers, a first filter circuit and a second filter circuit, and at least one intermediate circuit. Each of the first filter circuit and the second filter circuit has the same or substantially the same configuration as that of the band pass filter according to the second preferred embodiment of the present invention, and is arranged in the same or substantially the same manner. In the band pass filter according to the third preferred embodiment of the present invention, the at least one intermediate circuit is positioned between the first filter circuit and the second filter circuit. Moreover, the at least one intermediate circuit is electromagnetically coupled to each of the first filter circuit and the second filter circuit. A center of the ground via conductor is located at a position shifted from a virtual line that connects a center of the first via conductor and a center of the second via conductor to each other.

The band pass filters according to preferred embodiments of the present invention can each generate an attenuation pole with the required amount of attenuation on at least one of the high frequency side and low frequency side of the pass band while maintaining the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
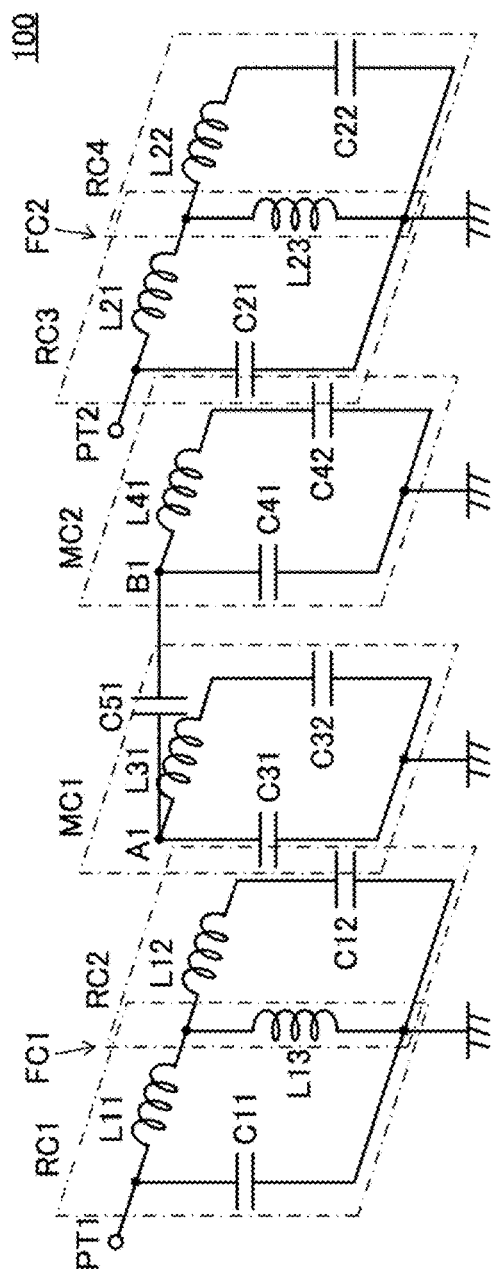
FIG. 1 is an equivalent circuit diagram of a band pass filter that is a first example of a first preferred embodiment of the present invention.

Preferred embodiments of the present invention will be described in detail below with reference to the drawings. Examples of band pass filters to which preferred embodiments of the present invention are applied include, but are not limited to, a multilayer ceramic filter obtained by simultaneously firing low-temperature fired ceramics and pattern conductors and via conductors.

First Preferred Embodiment of Band Pass Filter

A band pass filter according to a first preferred embodiment of the present invention relates to the generation of an attenuation pole on a high frequency side of a pass band, and includes a capacitor that connects a first intermediate circuit and a second intermediate circuit, which will be described later, to each other.

First Example

A band pass filter 100 that is a first example of the first preferred embodiment will be described with reference to FIGS. 1 to 3.

An exploded perspective view to be described later is a schematic view. For example, the thickness of each of dielectric layers and pattern conductors, the thickness of via conductors, and the like are schematic. Moreover, variations in the shape of respective elements, variations occurring in a manufacturing process, and the like are not necessarily reflected in the drawings. That is, the drawings used for explanation in this description represent features of an actual product even if there are some portions that are different from those of the actual product.

FIG. 1 is an equivalent circuit diagram of the band pass filter 100. The band pass filter 100 includes a first filter circuit FC1, a second filter circuit FC2, a first intermediate circuit MC1, and a second intermediate circuit MC2.

The first filter circuit FC1 includes a first resonant circuit RC1 and a second resonant circuit RC2. The first resonant circuit RC1 includes a first inductor L11, a third inductor L13, and a first capacitor C11. The second resonant circuit RC2 includes a second inductor L12, a third inductor L13, and a second capacitor C12.

In the first resonant circuit RC1, the first inductor L11 connected in series to the third inductor L13 and the first capacitor C11 are connected in parallel to each other. In the second resonant circuit RC2, the second inductor L12 connected in series to the third inductor L13 and the second capacitor C12 are connected in parallel to each other. The third inductor L13 is a common element in the first resonant circuit RC1 and the second resonant circuit RC2.

The first filter circuit FC1 further includes a first port PT1 connected to a connection point of the first inductor L11 and the first capacitor C11. Moreover, in the first filter circuit FC1, a connection point of the first capacitor C11, the second capacitor C12, and the third inductor L13 is grounded.

The second filter circuit FC2 includes a third resonant circuit RC3 and a fourth resonant circuit RC4. The third resonant circuit RC3 includes a fourth inductor L21, a sixth inductor L23, and a third capacitor C21. The fourth resonant circuit RC4 includes a fifth inductor L22, a sixth inductor L23, and a fourth capacitor C22.

In the third resonant circuit RC3, the fourth inductor L21 connected in series to the sixth inductor L23 and the third capacitor C21 are connected in parallel to each other. In the fourth resonant circuit RC4, the fifth inductor L22 connected in series to the sixth inductor L23 and the fourth capacitor C22 are connected in parallel to each other. The sixth inductor L23 is a common element in the third resonant circuit RC3 and the fourth resonant circuit RC4.

The second filter circuit FC2 further includes a second port PT2 connected to a connection point of the fourth inductor L21 and the third capacitor C21. Moreover, in the second filter circuit FC2, a connection point of the third capacitor C21, the fourth capacitor C22, and the sixth inductor L23 is grounded.

The first intermediate circuit MC1 includes a fifth capacitor C31, a sixth capacitor C32, and a seventh inductor L31. Each of the fifth capacitor C31 and the sixth capacitor C32 is connected to the ground. The seventh inductor L31 is connected between the fifth capacitor C31 and the sixth capacitor C32. That is, one of capacitor electrodes which defines the fifth capacitor C31 is connected to the ground, and the other thereof is connected to one end of the seventh inductor L31. Moreover, one of capacitor electrodes which defines the sixth capacitor C32 is connected to the ground, and the other capacitor electrode thereof is connected to the other end of the seventh inductor L31. The first intermediate circuit MC1 defines and functions as a resonant circuit. That is, the first intermediate circuit MC1 defines a resonant circuit in the central stage of the band pass filter 100.

The second intermediate circuit MC2 includes a seventh capacitor C41, an eighth capacitor C42, and an eighth inductor L41. Each of the seventh capacitor C41 and the eighth capacitor C42 is connected to the ground. The eighth inductor L41 is connected between the seventh capacitor C41 and the eighth capacitor C42. That is, one of capacitor electrodes which defines the seventh capacitor C41 is connected to the ground, and the other capacitor electrode thereof is connected to one end of the eighth inductor L41. Moreover, one of capacitor electrodes which defines the eighth capacitor C42 is connected to the ground, and the capacitor electrode other thereof is connected to the other end of the eighth inductor L41. The second intermediate circuit MC2 defines and functions as a resonant circuit. That is, the second intermediate circuit MC2 defines a resonant circuit in the central stage of the band pass filter 100.

The seventh inductor L31 is electromagnetically coupled to each of the first inductor L11, the second inductor L12, and the third inductor L13. The eighth inductor L41 is electromagnetically coupled to each of the fourth inductor L21, the fifth inductor L22, and the sixth inductor L23. Further, the seventh inductor L31 and the eighth inductor L41 are also electromagnetically coupled to each other.

The band pass filter 100 further includes a ninth capacitor C51. The ninth capacitor C51 is connected between a connection point A1 between the fifth capacitor C31 and the seventh inductor L31 and a connection point B1 between the seventh inductor L31 and the eighth inductor L41.

Figure 2:
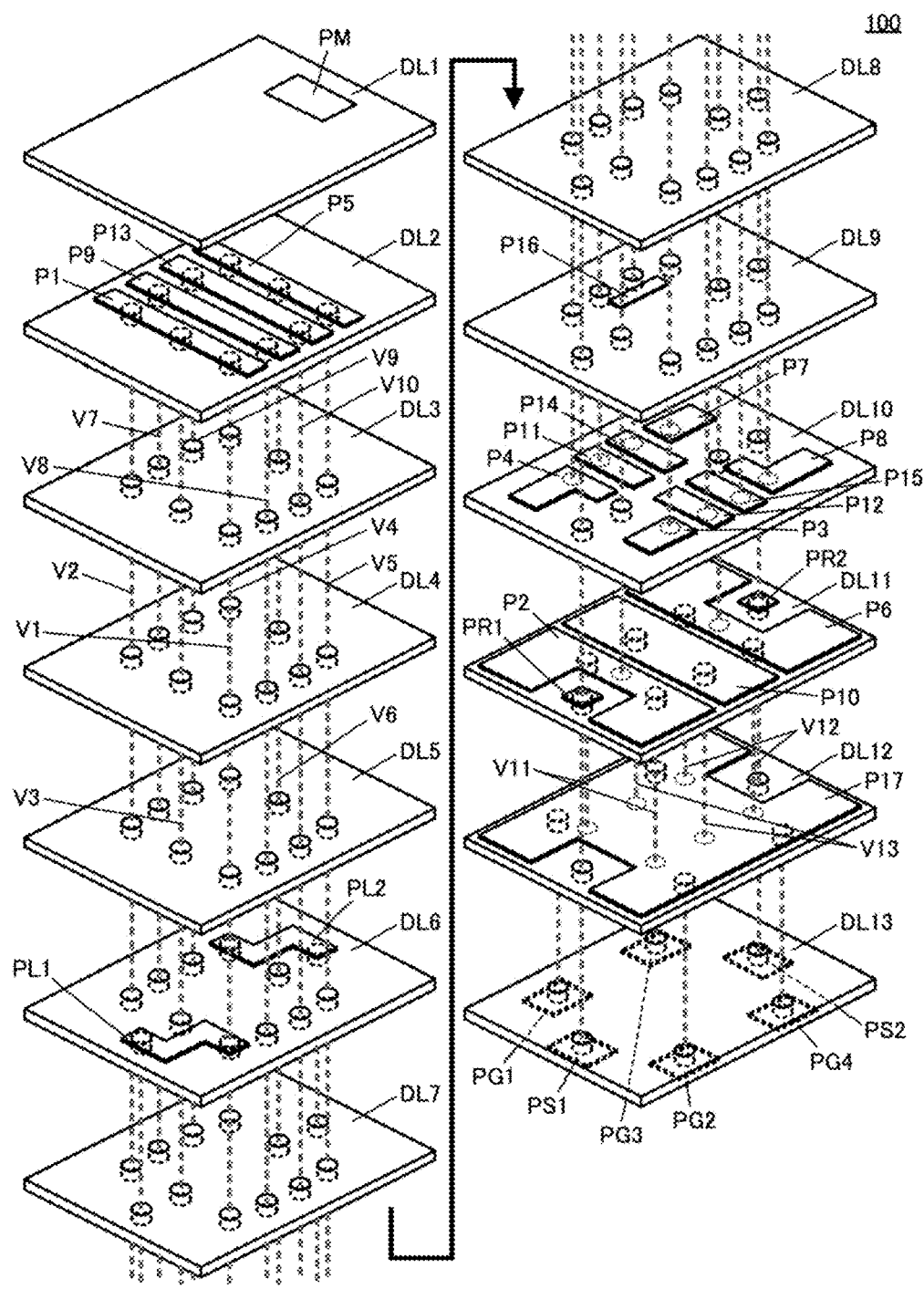
FIG. 2 is an exploded perspective view of the band pass filter of FIG. 1.

FIG. 2 is an exploded perspective view of the band pass filter 100. The band pass filter 100 includes laminated dielectric layers DL1 to DL13; the first filter circuit and the second filter circuit; the first intermediate circuit and the second intermediate circuit; and a rectangular first intermediate capacitor electrode P16. Note that, in FIG. 2, a direction mark PM is provided on the dielectric layer DL1. However, this is not required (the same applies below).

The first filter circuit and the second filter circuit are side by side in a direction perpendicular or substantially perpendicular to a lamination direction of the dielectric layers DL1 to DL13. The first intermediate circuit and the second intermediate circuit are side by side between the first filter circuit and the second filter circuit. Moreover, the first intermediate circuit is electromagnetically coupled to the first filter circuit. The second intermediate circuit is electromagnetically coupled to each of the second filter circuit and the first intermediate circuit.

The first filter circuit includes a first line electrode P1, a first ground electrode P2, a first capacitor electrode P3, a second capacitor electrode P4, a first via conductor V1, a second via conductor V2, and a ground via conductor V3. The first line electrode P1 and the first capacitor electrode P3 have a rectangular or substantially rectangular shape, the first ground electrode P2 has an angular C shape, and the second capacitor electrode P4 has an L shape, for example. However, such shapes of the respective electrodes are not limited to these. For example, the first ground electrode P2 may be divided into a first portion and a second portion.

The first line electrode P1 is provided on the dielectric layer DL2. That is, the first line electrode P1 extends in a direction perpendicular or substantially perpendicular to the lamination direction of the dielectric layers DL1 to DL13. When viewed from the lamination direction, the first capacitor electrode P3 and the second capacitor electrode P4 face the first ground electrode P2 with the dielectric layer DL10 interposed therebetween so that at least a portion of each thereof overlaps the first ground electrode P2.

That is, the first capacitor C11 includes the first capacitor electrode P3 and the first ground electrode P2. The second capacitor C12 includes the second capacitor electrode P4 and the first ground electrode P2. Note that, when the first ground electrode P2 is divided into the first portion and the second portion, the first capacitor C11 may include the first portion, and the second capacitor C12 may include the second portion.

The first via conductor V1 penetrates the dielectric layers DL2 to DL9, and connects the first line electrode P1 and the first capacitor electrode P3 to each other. The second via conductor V2 penetrates the dielectric layers DL2 to DL9, and connects the first line electrode P1 and the second capacitor electrode P4 to each other. Then, the ground via conductor V3 is between the first via conductor V1 and the second via conductor V2, penetrates the dielectric layers DL2 to DL10, and connects the first line electrode P1 and the first ground electrode P2 to each other.

Specifically, when a lower surface of each of the electrodes is one main surface and an upper surface thereof is the other main surface in FIG. 2, one end of the first via conductor V1 is connected to one main surface of the first line electrode P1, and the other end thereof is connected to the other main surface of the first capacitor electrode P3. One end of the second via conductor V2 is connected to the one main surface of the first line electrode P1, and the other end thereof is connected to the other main surface of the second capacitor electrode P4. One end of the ground via conductor V3 is connected to the one main surface of the first line electrode P1, and the other end thereof is connected to the other main surface of the first ground electrode P2.

The first inductor L11 includes the first via conductor V1. The second inductor L12 includes the second via conductor V2. The third inductor L13 includes the ground via conductor V3.

Note that an extended electrode PL1 is connected to the first via conductor V1. Specifically, the extended electrode PL1 is provided in order to connect the first via conductor V1, which is provided in outer peripheral edge portions of the dielectric layers, to a signal electrode PS1 provided on the central portion of the dielectric. In the band pass filter 100, the extended electrode PL1 has an angular S shape, for example. However, a shape thereof is not limited to this. A connection point between the first via conductor V1 and the extended electrode PL1 is set according to an inductance design of the first inductor L11. The extended electrode PL1 is connected to the signal electrode PS1 provided on an outer surface (lower side of the drawing) of the dielectric layer DL13.

The second filter circuit includes a first line electrode P5, a first ground electrode P6, a first capacitor electrode P7, a second capacitor electrode P8, a first via conductor V4, a second via conductor V5, and a ground via conductor V6. The first line electrode P5 and the first capacitor electrode P7 have a rectangular or substantially rectangular shape, the first round electrode P6 has an angular C shape, and the second capacitor electrode P8 has an L shape, for example. However, such shapes of the respective electrodes are not limited to these. For example, the first ground electrode P6 may be divided into a first portion and a second portion.

The first line electrode P5 is provided on the dielectric layer DL2. That is, the first line electrode P5 extends in the direction perpendicular or substantially perpendicular to the lamination direction of the dielectric layers DL1 to DL13. When viewed from the lamination direction, the first capacitor electrode P7 and the second capacitor electrode P8 face the first ground electrode P2 with the dielectric layer DL10 interposed therebetween so that at least a portion of each thereof overlaps the first ground electrode P6.

The third capacitor C21 includes the first capacitor electrode P7 and the first ground electrode P6. The fourth capacitor C22 includes the second capacitor electrode P8 and the first ground electrode P6. When the first ground electrode P6 is divided into the first portion and the second portion, the third capacitor C21 may include the first portion, and the fourth capacitor C22 may include the second portion.

The first via conductor V4 penetrates the dielectric layers DL2 to DL9, and connects the first line electrode P5 and the first capacitor electrode P7 to each other. The second via conductor V5 penetrates the dielectric layers DL2 to DL9, and connects the first line electrode P5 and the second capacitor electrode P8 to each other. The ground via conductor V6 is between the first via conductor V4 and the second via conductor V5, penetrates the dielectric layers DL2 to DL10, and connects the first line electrode P5 and the first ground electrode P6 to each other.

Specifically, one end of the first via conductor V4 is connected to the one main surface of the first line electrode P5, and the other end thereof is connected to the other main surface of the first capacitor electrode P7. One end of the second via conductor V5 is connected to the one main surface of the first line electrode P5, and the other end thereof is connected to the other main surface of the second capacitor electrode P8. Then, one end of the ground via conductor V6 is connected to the one main surface of the first line electrode P5, and the other end thereof is connected to the other main surface of the first ground electrode P6.

The fourth inductor L21 includes the first via conductor V4. The fifth inductor L22 includes the second via conductor V5. The sixth inductor L23 includes the ground via conductor V6.

An extended electrode PL2 is connected to the first via conductor V4. Specifically, the extended electrode PL2 is provided to connect the first via conductor V4, which is provided in outer peripheral edge portions of the dielectric layers, which are opposite to the outer peripheral edge portions of the dielectric layers, the outer peripheral edge portions including the first via conductor V1 provided therein, to a signal electrode PS2 provided on the central portion of the dielectric. In the band pass filter 100, the extended electrode PL2 has an angular S shape, for example. However, a shape thereof is not limited to this. A connection point between the first via conductor V4 and the extended electrode PL2 is set according to an inductance design of the fourth inductor L21. The extended electrode PL2 is connected to the signal electrode PS2 provided on the outer surface (lower side of the drawing) of the dielectric layer DL13.

The first intermediate circuit includes a second line electrode P9, a second ground electrode P10, a third capacitor electrode P11, a fourth capacitor electrode P12, a third via conductor V7, and a fourth via conductor V8. Each of the second line electrode P9, the second ground electrode P10, the third capacitor electrode P11, and the fourth capacitor electrode P12 has a rectangular or substantially rectangular shape, for example. However, such a shape of each of the electrodes is not limited to this.

The second line electrode P9 is provided on the dielectric layer DL2. That is, the second line electrode P9 extends in the direction perpendicular or substantially perpendicular to the lamination direction of the dielectric layers DL1 to DL13. When viewed from the lamination direction, the third capacitor electrode P11 and the fourth capacitor electrode P12 face the second ground electrode P10 with the dielectric layer DL10 interposed therebetween so that at least a portion of each thereof overlaps the second ground electrode P10.

The fifth capacitor C31 includes the third capacitor electrode P11 and the second ground electrode P10. The sixth capacitor C32 includes the fourth capacitor electrode P12 and the second ground electrode P10.

The third via conductor V7 penetrates the dielectric layers DL2 to DL9, and connects the second line electrode P9 and the third capacitor electrode P11 to each other. The fourth via conductor V8 penetrates the dielectric layers DL2 to DL9, and connects the second line electrode P9 and the fourth capacitor electrode P12 to each other. Specifically, one end of the third via conductor V7 is connected to one main surface of the second line electrode P9, and the other end thereof is connected to the other main surface of the third capacitor electrode P11. One end of the fourth via conductor V8 is connected to the one main surface of the second line electrode P9, and the other end thereof is connected to the other main surface of the fourth capacitor electrode P12.

The seventh inductor L31 includes the second line electrode P9, the third via conductor V7, and the fourth via conductor V8.

The second intermediate circuit includes a second line electrode P13, a second ground electrode P10, a third capacitor electrode P14, a fourth capacitor electrode P15, a third via conductor V9, and a fourth via conductor V10. The second ground electrode P10 is a common element in the first intermediate circuit and the second intermediate circuit.

Each of the second line electrode P13, the third capacitor electrode P14, and the fourth capacitor electrode P15 has a rectangular or substantially rectangular shape, for example. However, such a shape of each of the electrodes is not limited to this.

The second line electrode P13 is provided on the dielectric layer DL2. That is, the second line electrode P13 extends in the direction perpendicular or substantially perpendicular to the lamination direction of the dielectric layers DL1 to DL13. When viewed from the lamination direction, the third capacitor electrode P14 and the fourth capacitor electrode P15 face the second ground electrode P10 with the dielectric layer DL10 interposed therebetween so that at least a portion of each thereof overlaps the second ground electrode P10.

The seventh capacitor C41 includes the third capacitor electrode P14 and the second ground electrode P10. The eighth capacitor C42 includes the fourth capacitor electrode P15 and the second ground electrode P10.

The third via conductor V9 penetrates the dielectric layers DL2 to DL9, and connects the second line electrode P13 and the third capacitor electrode P14 to each other. The fourth via conductor V10 penetrates the dielectric layers DL2 to DL9, and connects the second line electrode P13 and the fourth capacitor electrode P15 to each other. Specifically, one end of the third via conductor V9 is connected to one main surface of the second line electrode P13, and the other end thereof is connected to the other main surface of the third capacitor electrode P14. One end of the fourth via conductor V10 is connected to the one main surface of the second line electrode P13, and the other end thereof is connected to the other main surface of the fourth capacitor electrode P15.

The eighth inductor L41 includes the second line electrode P13, the third via conductor V9, and the fourth via conductor V10.

The first intermediate capacitor electrode P16 faces the third capacitor electrode P11 of the first intermediate circuit and the third capacitor electrode P14 of the second intermediate circuit with the dielectric layer DL9 interposed therebetween. Specifically, one main surface of the first intermediate capacitor electrode P16 and the other main surface of the third capacitor electrode P11 of the first intermediate circuit face each other with the dielectric layer DL9 interposed therebetween. Moreover, the one main surface of the first intermediate capacitor electrode P16 and the other main surface of the third capacitor electrode P14 of the second intermediate circuit face each other with the dielectric layer DL9 interposed therebetween.

The second ground electrode P10 may be divided into a plurality of portions. In that case, the fifth capacitor C31, the sixth capacitor C32, the seventh capacitor C41, and the eighth capacitor C42 may individually include the divided portions of the second ground electrode P10.

Figure 3:
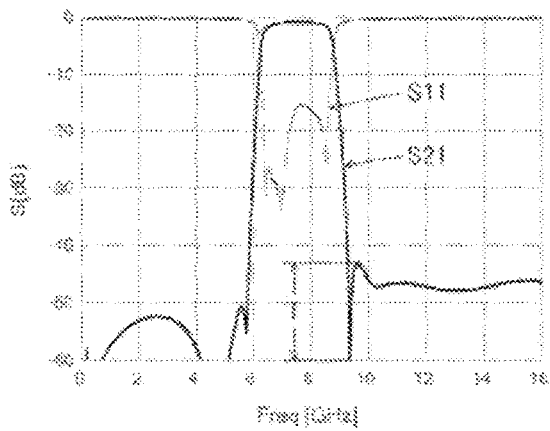
FIG. 3 is a filter characteristic diagram of the band pass filter of FIG. 1.

FIG. 3 illustrates filter characteristics of the band pass filter 100 when capacitance of each of the capacitors and inductance of each of the inductors are set to predetermined values. Focusing on S21 as the filter characteristics, when a pass band is defined by frequencies at which an insertion loss is reduced by about 3 dB from a flat portion, a band range from approximately 6.3 GHz to approximately 8.7 GHz can be regarded as a pass band in the band pass filter 100. Then, at approximately 5.7 GHz on a low frequency side of the pass band, there is an attenuation pole at which the frequency is sharply attenuated to approximately −55 dB, and at approximately 9.4 GHz on a high frequency side thereof, there is an attenuation pole at which the frequency is sharply attenuated to approximately −60 dB. The fact that such attenuation on the high frequency side is obtained results from the fact that propagation of a signal through the ground is reduced or minimized since a structure is provided in which, between the first filter circuit and the second filter, the intermediate circuits each of which include a different ground from that of each of the first filter circuit and the second filter circuit are provided. Moreover, the intermediate capacitor electrode P16 is provided, such that a larger attenuation pole can be set at a desired frequency.

Second Example

A band pass filter 100A that is a second example of the first preferred embodiment will be described with reference to FIGS. 4 to 6.

Figure 4:
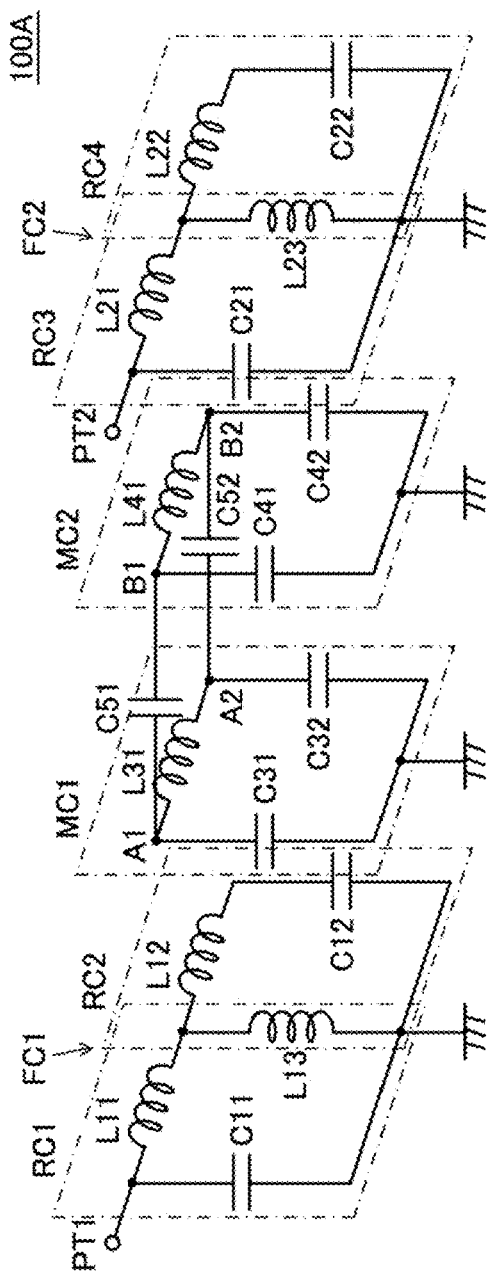
FIG. 4 is an equivalent circuit diagram of a band pass filter that is a second example of the first preferred embodiment of the present invention.

FIG. 4 is an equivalent circuit diagram of the band pass filter 100A. The band pass filter 100A further includes a tenth capacitor C52. In the band pass filter 100A, the ninth capacitor C51 is connected between the connection point A1 and the connection point B1. Further, the tenth capacitor C52 is connected between a connection point A2 between the sixth capacitor C32 and the seventh inductor L31 and the connection point B2. Elements other than these are the same or substantially the same as those of the band pass filter 100.

Figure 5:
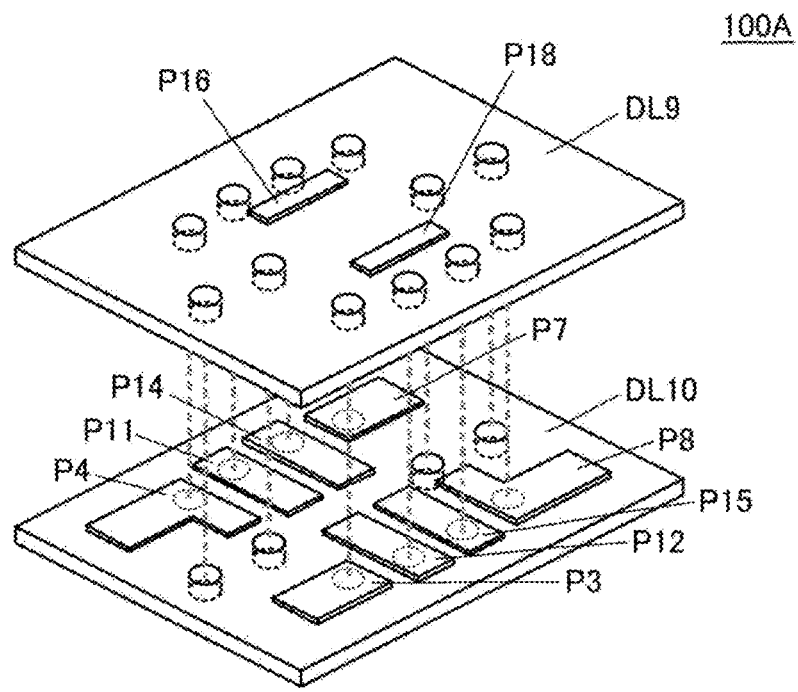
FIG. 5 is an exploded perspective view of a portion of the band pass filter of FIG. 4.

FIG. 5 is an exploded perspective view of a portion of the band pass filter 100A. Specifically, the dielectric layers DL9 and DL10, the first capacitor electrodes P3 and P7, the second capacitor electrodes P4 and P8, the third capacitor electrodes P11 and P14, the fourth capacitor electrode P12 and P15, the first intermediate capacitor electrode P16, and a second intermediate capacitor electrode P18 are illustrated. The band pass filter 100A further includes a rectangular or substantially rectangular second intermediate capacitor electrode P18, for example. However, such a shape of the second intermediate capacitor electrode P18 is not limited to this. In the band pass filter 100A, the first intermediate capacitor electrode P16 is configured similarly to the band pass filter 100.

Moreover, the second intermediate capacitor electrode P18 faces the fourth capacitor electrode P12 of the first intermediate circuit and the fourth capacitor electrode P15 of the second intermediate circuit with the dielectric layer DL9 interposed therebetween. Specifically, one main surface of the second intermediate capacitor electrode P18 and the other main surface of the fourth capacitor electrode P12 of the first intermediate circuit face each other with the dielectric layer DL9 interposed therebetween. Moreover, the one main surface of the second intermediate capacitor electrode P18 and the other main surface of the fourth capacitor electrode P15 of the second intermediate circuit face each other with the dielectric layer DL9 interposed therebetween. Elements other than these are the same or substantially the same as those of the band pass filter 100.

Figure 6:
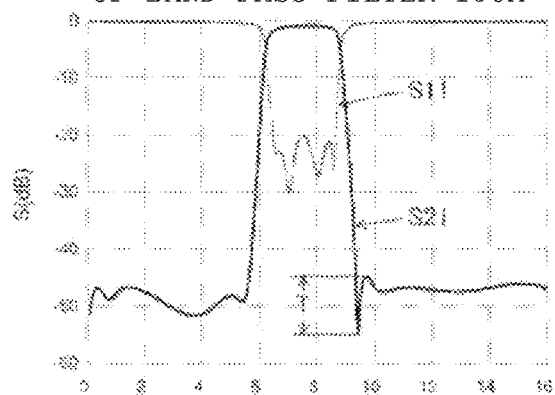
FIG. 6 is a filter characteristic diagram of the band pass filter of FIG. 4.

FIG. 6 illustrates filter characteristics of the band pass filter 100A when the capacitance of each of the capacitors and inductance of each of the inductors are set to predetermined values. Focusing on S21 as the filter characteristics, a pass band of the band pass filter 100A is approximately 6.3 GHz to approximately 8.7 GHz, which can be regarded as substantially unchanged from the pass band of the band pass filter 100. Then, at approximately 5.7 GHz on a low frequency side of the pass band, there is an attenuation pole at which the frequency is sharply attenuated to approximately −50 dB, and at approximately 9.4 GHz on a high frequency side thereof, there is an attenuation pole at which the frequency is sharply attenuated to approximately −55 dB.

From the first and second examples described above, in the band pass filter according to the first preferred embodiment, an attenuation pole having a required amount of attenuation can be generated on the high frequency side of the passband while maintaining the pass band.

Further, when the ninth capacitor C51 and the tenth capacitor C52 are provided as in the second example, a decrease degree T of an amount of attenuation on a higher frequency side can be made smaller than the amount of attenuation at the attenuation pole on the high frequency side, and the amount of attenuation on the high frequency side of the pass band frequency can be made large (see FIGS. 3 and 6).

Each of the band pass filters 100 and 100A further includes a third ground electrode P17, fifth via conductors V11, sixth via conductors V12, and seventh via conductors V13. Moreover, the first ground electrode P2 and the second ground electrode P10 are spaced apart from each other. The third ground electrode P17 is connected to external ground electrodes PG1 to PG4.

Then, the first ground electrode P2 in the first filter circuit FC1 and the third ground electrode P17 are connected to each other by the fifth via conductors V11. The first ground electrode P6 in the second filter circuit FC2 and the third ground electrode P17 are connected to each other by the sixth via conductors V12. The second ground electrode P10 in the first intermediate circuit MC1 and the second intermediate circuit MC2 and the third ground electrode P17 are connected to each other by the seventh via conductors V13. In FIG. 2, a plurality of the fifth via conductors V11, a plurality of the sixth via conductors V12, and a plurality of the seventh via conductors V13 are provided. However, a single fifth via conductor, a single sixth via conductor, and a single seventh via conductor may be provided.

With the above structure, the inductance between the first filter circuit and the ground can be adjusted independently. Similarly, the inductance between the second filter circuit and ground, as well as the inductance between the first intermediate circuit and the second intermediate circuit and the ground, can be adjusted independently.

Second Preferred Embodiment of Band Pass Filter

A band pass filter according to a second preferred embodiment of the present invention relates to the generation of an attenuation pole on a low frequency side of a pass band, and is characterized in a positional relationship between the first via conductor V1, the second via conductor V2, and the ground via conductor V3.

First Example

A band pass filter 100B that is a first example of the second preferred embodiment will be described with reference to FIGS. 7 to 9.

Since an equivalent circuit diagram of the band pass filter 100B is the same or substantially the same as the equivalent circuit diagram of the band pass filter 100A, illustration thereof is omitted. The band pass filter 100B includes the first filter circuit FC1, the second filter circuit FC2, the first intermediate circuit MC1, the second intermediate circuit MC2, a ninth capacitor C51, and a tenth capacitor C52. However, in the band pass filter 100B, the ninth capacitor C51 and the tenth capacitor C52 are not required elements.

Figure 7:
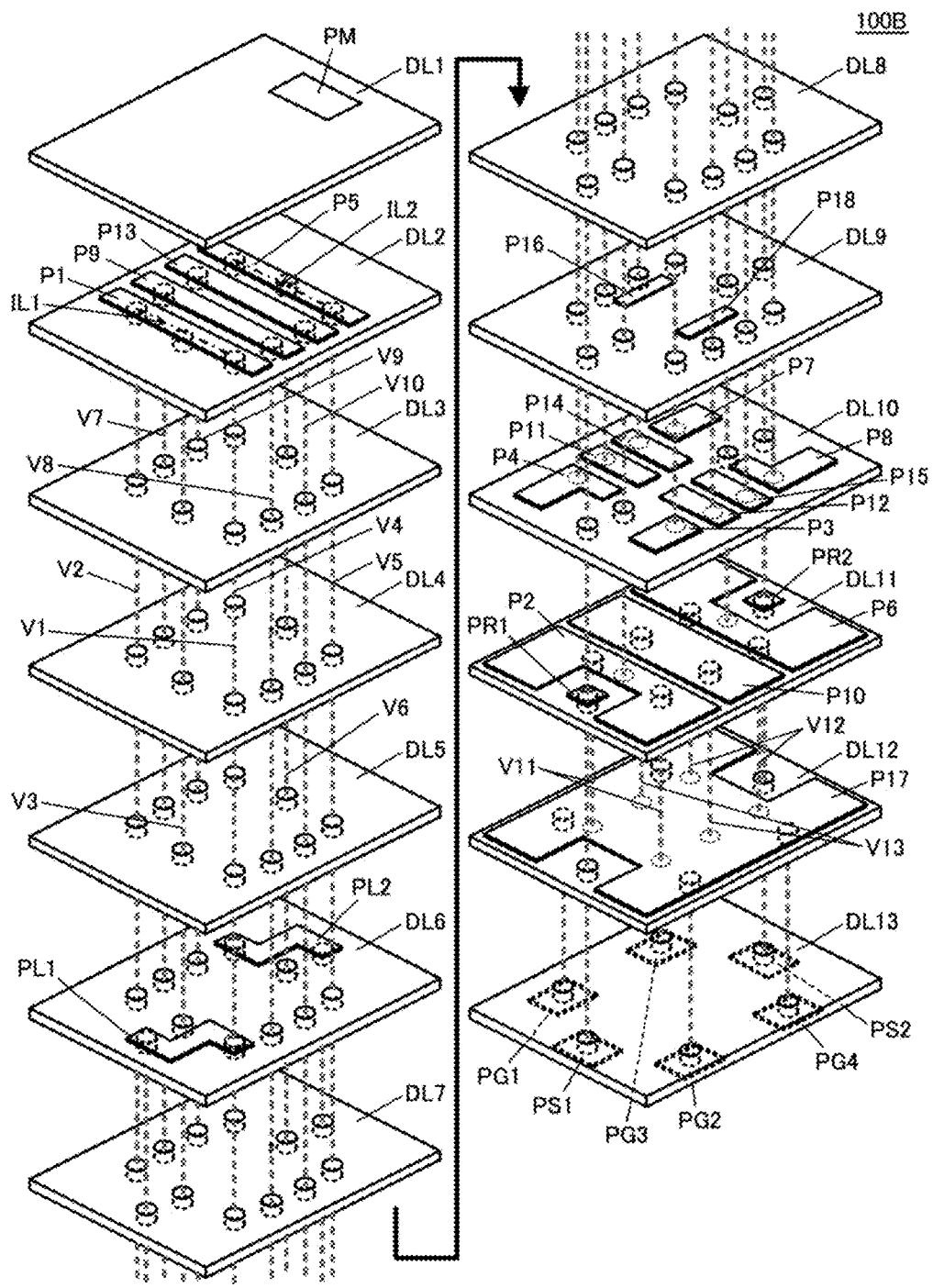
FIG. 7 is an exploded perspective view of the band pass filter that is a first example of a second preferred embodiment of the present invention.
Figure 8:
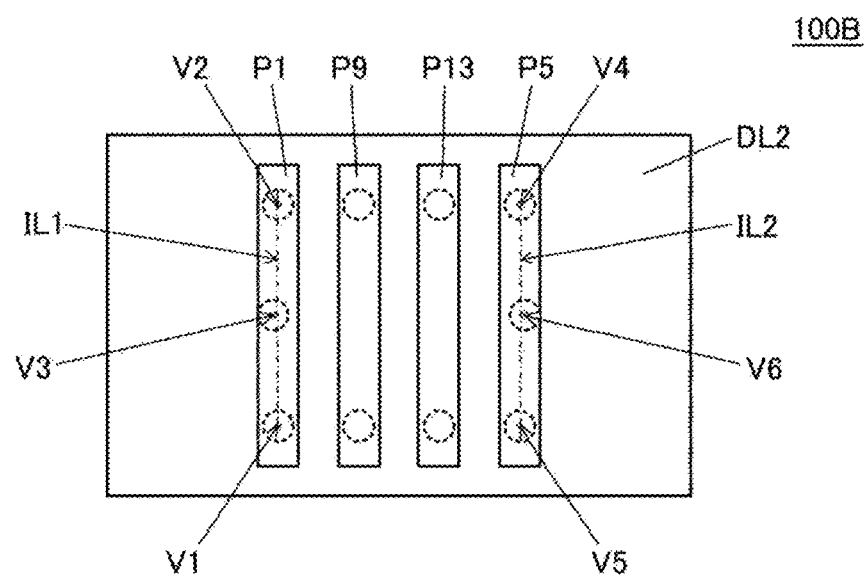
FIG. 8 is a plan view of a portion of the band pass filter of FIG. 7.

FIG. 7 is an exploded perspective view of the band pass filter 100B. Moreover, FIG. 8 is a plan view of a portion of the band pass filter 100B. The band pass filter 100B includes the laminated dielectric layers DL1 to DL13; the first filter circuit and the second filter circuit; the first intermediate circuit and the second intermediate circuit: the first intermediate capacitor electrode P16; and the second intermediate capacitor electrode P18. The basic structure of the band pass filter 100B is the same or substantially the same as that of the band pass filter 100A.

Here, each of the first via conductor V1, the second via conductor V2, and the ground via conductor V3 in the first filter circuit of the band pass filter 100B is referred to as a column having a center. Similarly, each of the first via conductor V4, the second via conductor V5, and the ground via conductor V6 in the second filter circuit is referred to as a column having a center.

The center of the ground via conductor V3 in the first filter circuit is located at a position shifted to an opposite side to the first intermediate circuit from a virtual line IL1 that connects the center of the first via conductor V1 and the second via conductor V2 to each other. The center of the ground via conductor V6 in the second filter circuit is located at a position shifted to an opposite side to the second intermediate circuit from a virtual line IL2 that connects the center of the first via conductor V4 and the second via conductor V5 to each other (see FIG. 8). Note that the "center of the via conductor" refers to the center of a circle when a columnar via conductor is viewed in plan view.

Note that the first line electrode P1 in the first filter circuit of the band pass filter 100B and the first line electrode P5 in the second filter circuit thereof have a rectangular or substantially rectangular shape as in the band pass filter 100A. Moreover, elements other than these are also the same or substantially the same as those of the band pass filter 100A.

Figure 9:
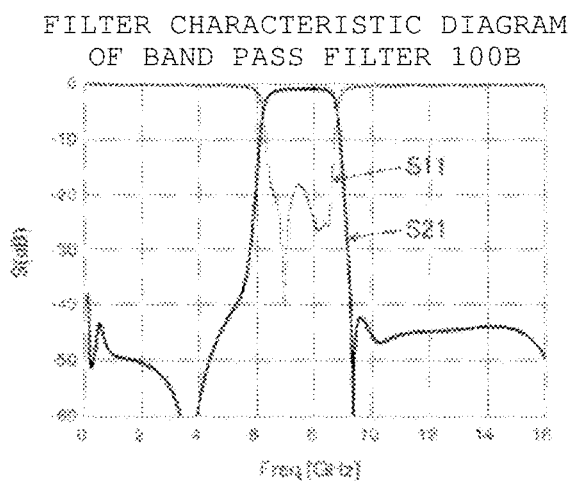
FIG. 9 is a filter characteristic diagram of the band pass filter of FIG. 7.

FIG. 9 illustrates filter characteristics of the band pass filter 100B when the capacitance of each of the capacitors and the inductance of each of the inductors are set to predetermined values. Focusing on S21 as the filter characteristics, a pass band of the band pass filter 100B is approximately 6.3 GHz to approximately 8.7 GHz, which is substantially unchanged from the pass band of the band pass filter 100. Then, in the vicinity of approximately 3.8 GHz on a low frequency side of the pass band, there is an attenuation pole at which the frequency is sharply attenuated, and at approximately 9.3 GHz on a high frequency side thereof, there is an attenuation pole at which the frequency is sharply attenuated to approximately −60 dB.

Second Example

A band pass filter 100C that is a second example of the second preferred embodiment will be described with reference to FIGS. 10 to 12.

Since an equivalent circuit diagram of the band pass filter 100C is the same or substantially the same as the equivalent circuit diagram of the band pass filter 100A, illustration thereof is omitted. The band pass filter 100C includes the first filter circuit FC1, the second filter circuit FC2, the first intermediate circuit MC1, the second intermediate circuit MC2, the ninth capacitor C51, and the tenth capacitor C52. However, similar to the band pass filter 100B, the ninth capacitor C51 and the tenth capacitor C52 are not required elements.

Figure 10:
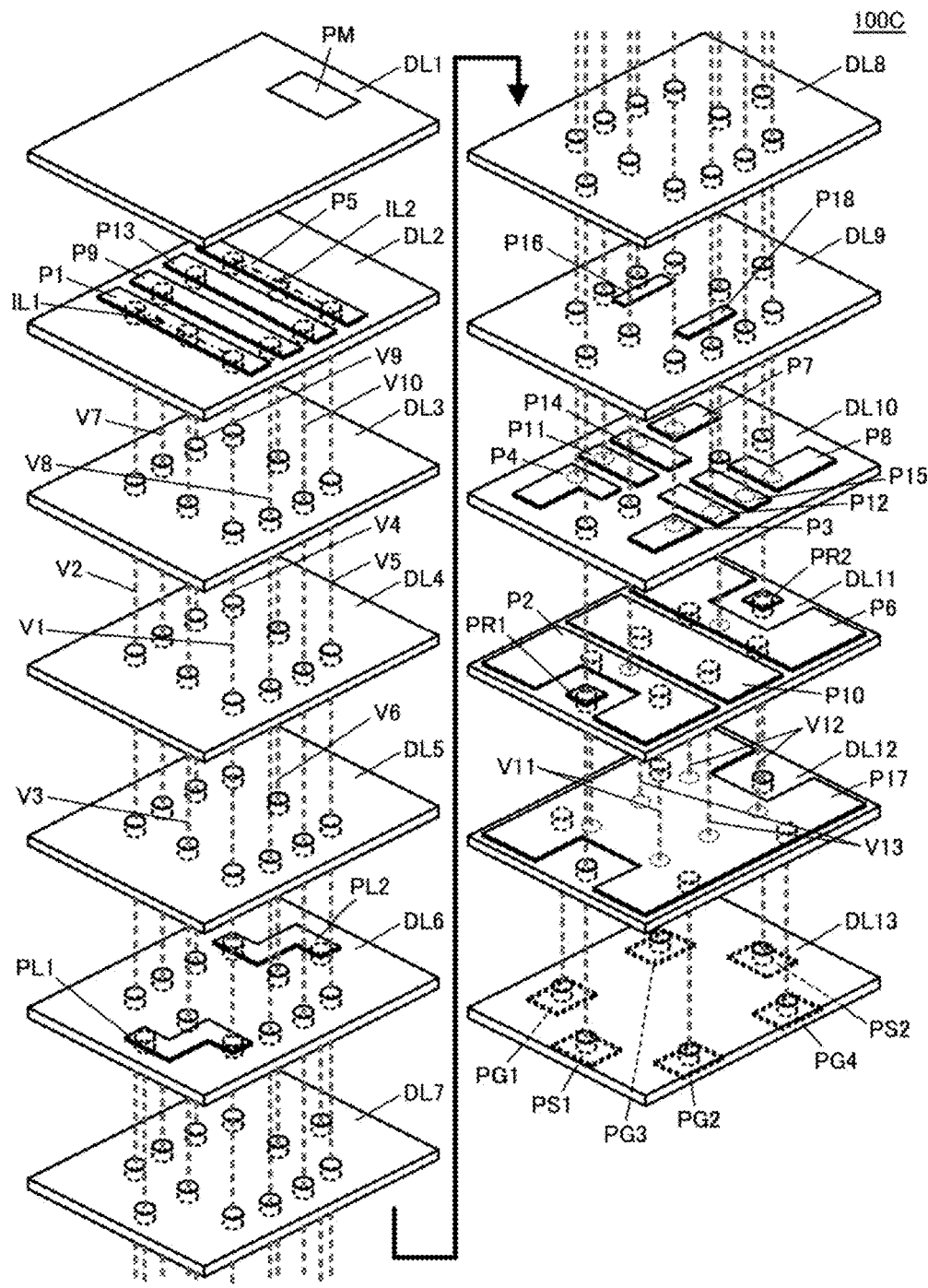
FIG. 10 is an exploded perspective view of a band pass filter that is a second example of the second preferred embodiment of the present invention.
Figure 11:
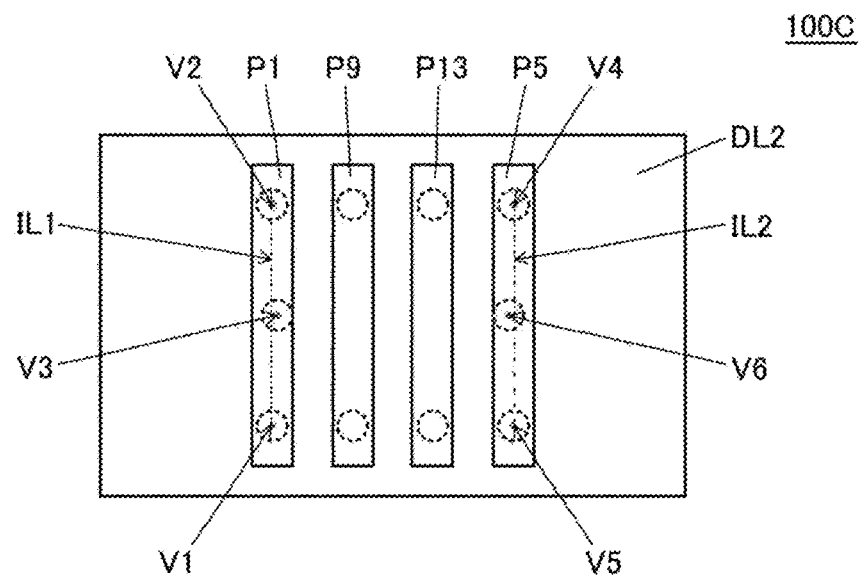
FIG. 11 is a plan view of a portion of the band pass filter of FIG. 10.

FIG. 10 is an exploded perspective view of the band pass filter 100C. FIG. 11 is a plan view of a portion of the band pass filter 100C. The basic structure of the band pass filter 100C is the same or substantially the same as that of the band pass filter 100B. That is, the center of the ground via conductor V3 in the first filter circuit is located at a position shifted from the virtual line IL1 toward the first intermediate circuit. The center of the ground via conductor V6 in the second filter circuit is located at a position shifted from the virtual line IL2 toward the second intermediate circuit.

Figure 12:
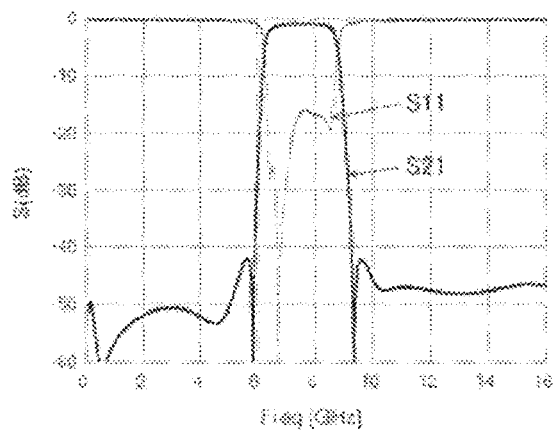
FIG. 12 is a filter characteristic diagram of the band pass filter of FIG. 10.

FIG. 12 illustrates filter characteristics of the band pass filter 100C when the capacitance of each of the capacitors and the inductance of each of the inductors are set to predetermined values. Focusing on S21 as the filter characteristics, a pass band of the band pass filter 100C is approximately 6.3 GHz to approximately 8.7 GHz, which is substantially unchanged from the pass band of the band pass filter 100. Then, at approximately 5.8 GHz on a low frequency side of the pass band, there is an attenuation pole at which the frequency is sharply attenuated to approximately −60 dB, and at approximately 9.4 GHz on a high frequency side thereof, there is an attenuation pole at which the frequency is sharply attenuated to approximately −60 dB.

From the first and second examples described above, in the band pass filter according to the second preferred embodiment, an attenuation pole having a required amount of attenuation can be generated on the low frequency side of the passband while maintaining the pass band.

Moreover, when the first line electrode of each of the filter circuits includes the second portion that protrudes toward the intermediate circuit adjacent thereto as in the second example, a distance at which the center of each of the ground via conductors is shifted from the virtual line can be increased. As a result, as illustrated in FIG. 12, the amount of attenuation at the attenuation pole on the low frequency side of the pass band can be increased.

Third to Fifth Examples

Figure 13A:
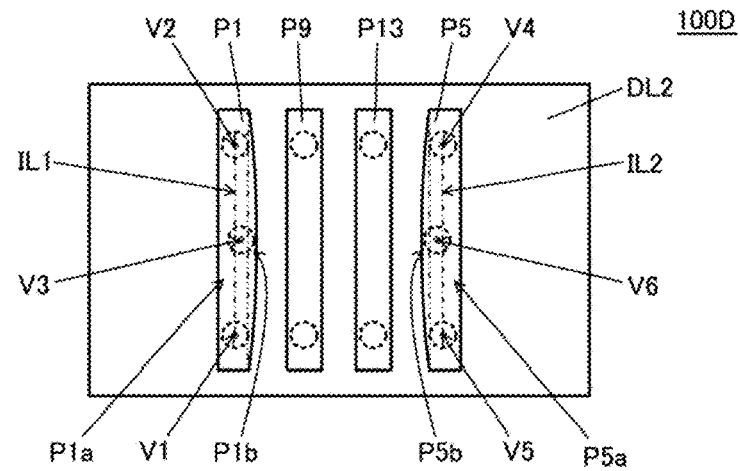
FIGS. 13A to 13C are plan views of a portion of a band pass filter that is a third example of the second preferred embodiment, of a portion of a band pass filter that is a fourth example of the second preferred embodiment, and of a portion of a band pass filter that is a fifth example of the second preferred embodiment of the present invention.
Figure 13B:
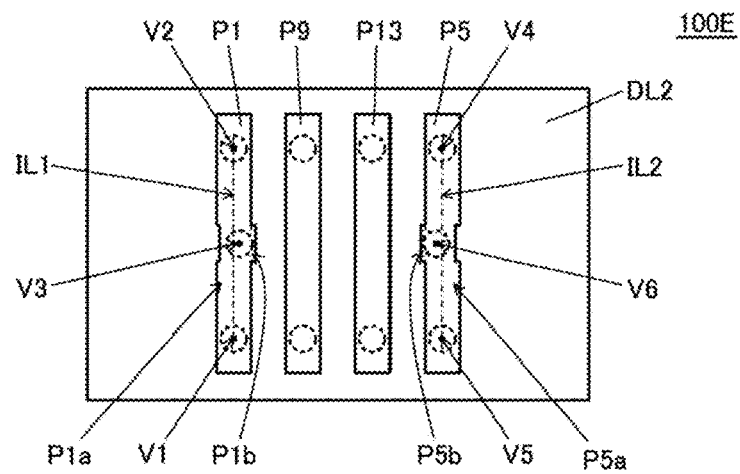
Figure 13C:
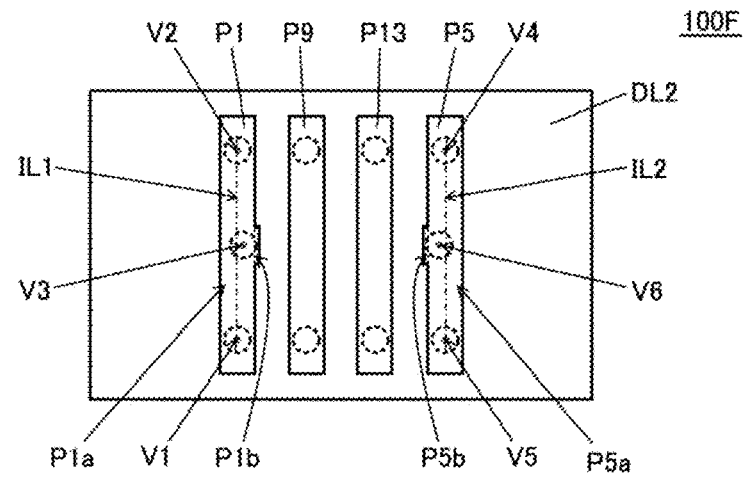

The shape of the first line electrode P1 in the first filter circuit and the shape of the first line electrode P5 in the second filter circuit are not limited to the above-described shape in which two rectangles are connected to each other. FIGS. 13A to 13C illustrate some modified examples. Note that elements other than these to be described below are the same or substantially the same as those of the band pass filter 100A.

FIG. 13A is a plan view of a portion of a band pass filter 100D that is a third example of the second preferred embodiment. Specifically, the dielectric layer DL2, the first line electrodes P1 and P5, and the second line electrodes P9 and P13 are illustrated. In the band pass filter 100D, a side of the first line electrode P1 in the first filter circuit, which is close to the first intermediate circuit, is curved. That is, the first line electrode P1 includes a rectangular first portion P1a; and a second portion P1b that is a region surrounded by the curved side and one side of the first portion. The same applies to the first line electrode P5 in the second filter circuit.

FIG. 13B is a plan view of a portion of a band pass filter 100E that is a fourth example of the second preferred embodiment. Specifically, the same elements as in FIG. 13A are illustrated. In the band pass filter 100E, the first line electrode P1 in the first filter circuit has a bent band shape. That is, the second portion P1b in the first line electrode P1 is a portion that is bent and protrudes toward the first intermediate circuit. The same also applies to the first line electrode P5 in the second filter circuit.

FIG. 13C is a plan view of a portion of a band pass filter 100F that is a fifth example of the second preferred embodiment. Specifically, the same elements as in FIG. 13A are illustrated. In the band pass filter 100F, the first line electrode P1 in the first filter circuit includes a first portion P1a, and a second portion P1b that protrudes from the first portion P1a toward the first intermediate circuit. That is, the first line electrode P1 has a shape in which two rectangles are connected to each other. Then, the ground via conductor V3 is connected to both of the first portion P1a and the second portion P1b. The same also applies to the first line electrode P5 in the second filter circuit.

Sixth Example

Figure 14:
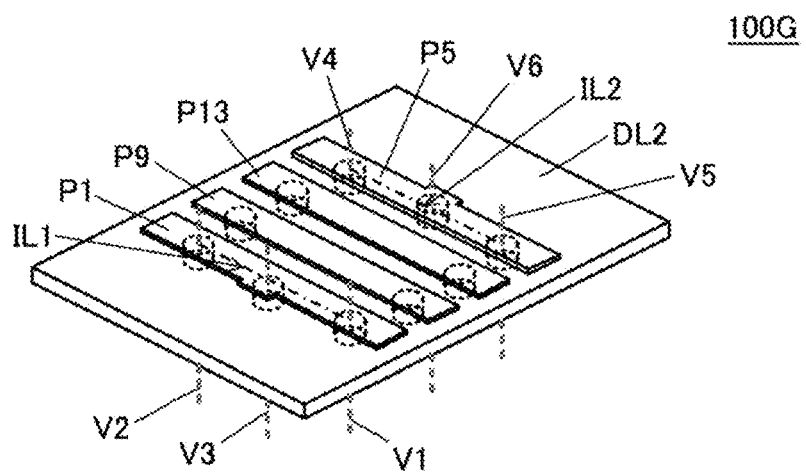
FIG. 14 is an exploded perspective view of portion of a band pass filter that is a sixth example of the second preferred embodiment of the present invention.

The direction in which the center of the ground via conductor V3 in the first filter circuit is shifted from the virtual line IL1 and the direction in which the center of the ground via conductor V6 in the second filter circuit is shifted from the virtual line IL2 are not limited to the above-described directions. FIG. 14 illustrates a sixth example of the second preferred embodiment. Note that elements other than these to be described below are the same as those of the band pass filter 100A.

FIG. 14 is an exploded perspective view of a portion of a band pass filter 100G that is a sixth example of the second preferred embodiment. In the band pass filter 100G, each of the first line electrode P1 of the first filter circuit and the first line electrode P5 of the second filter circuit has a shape in which two rectangles are connected to each other, and a similar structure to that of the band pass filter 100F is provided.

On the other hand, in the band pass filter 100G, the direction in which the center of the ground via conductor V3 is shifted from the virtual line IL1 and the direction in which the center of the ground via conductor V6 is shifted from the virtual line IL2 are opposite to those in the band pass filter 100F.

It has been confirmed that changing the direction in which the center of each of the ground via conductors is shifted from the virtual line as described above, also makes it possible to generate each of the attenuation poles with a required amount of attenuation on the low frequency side of the pass band while maintaining the pass band.

Note that, as described in the first preferred embodiment, each of the band pass filters 100B to 100G further includes a third ground electrode P17, fifth via conductors V11, sixth via conductors V12, and seventh via conductors V13. Moreover, the first ground electrode P2 and the second ground electrode P10 are spaced apart from each other. The third ground electrode P17 is connected to external ground electrodes PG1 to PG4.

Then, the first ground electrode P2 in the first filter circuit and the third ground electrode P17 are connected to each other by the fifth via conductors V11. The first ground electrode P6 in the second filter circuit and the third ground electrode P17 are connected to each other by the sixth via conductors V12. The second ground electrode P10 in the first and second intermediate circuits and the third ground electrode P17 are connected to each other by the seventh via conductors V13.

With the above-described structure, the inductance between the first filter circuit and the ground can be adjusted independently. Similarly, the inductance between the second filter circuit and ground, as well as the inductance between the first intermediate circuit and the second intermediate circuit and the ground, can be adjusted independently.

Moreover, as illustrated in FIG. 7 and FIG. 10, preferably, the center of each of the ground via conductors is shifted from the virtual line toward the adjacent intermediate circuit, and the capacitor that connects the first intermediate circuit and the second intermediate circuit to each other is provided.

In such a manner, the attenuation poles with required amounts of attenuation can be generated on both of the low frequency side and high frequency side of the pass band while maintaining the pass band.

Moreover, as illustrated in FIGS. 7 and 10, preferably, the intermediate circuits are connected to each other using two intermediate capacitor electrodes. In that case, the decrease degree T of the amount of attenuation on the higher frequency side can be made smaller than the amount of attenuation at the attenuation pole on the high frequency side.

Third Preferred Embodiment of Band Pass Filter

A band pass filter according to a third preferred embodiment of the present invention has the same characteristics as those of the second preferred embodiment.

A band pass filter 100H according to the third preferred embodiment will be described with reference to FIGS. 15 and 16.

Figure 15:
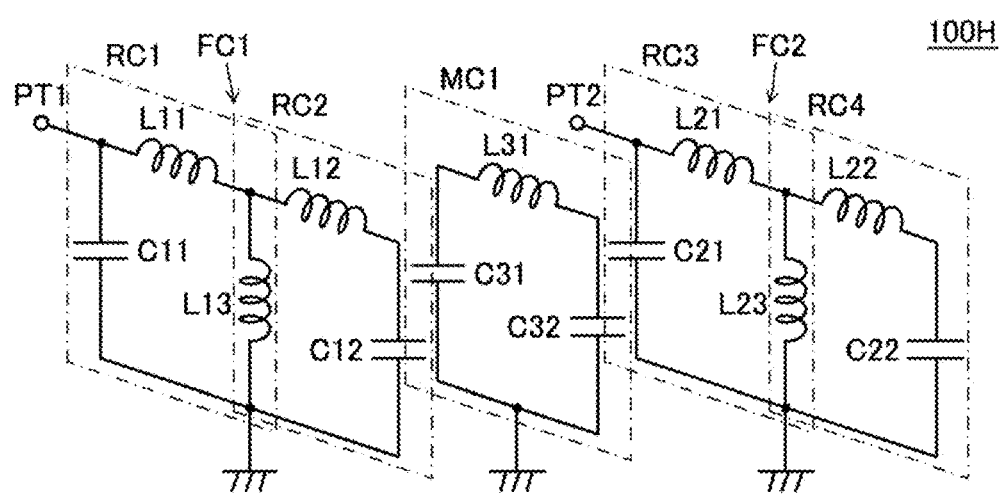
FIG. 15 is an equivalent circuit diagram of a band pass filter that is an example of a third preferred embodiment of the present invention.

FIG. 15 is an equivalent circuit diagram of the band pass filter 100H. The band pass filter 100H includes the first filter circuit FC1, the second filter circuit FC2, and the first intermediate circuit MC1.

The first filter circuit FC1, the second filter circuit FC2, and the first intermediate circuit MC1 have the same or substantially the same configurations as those of the band pass filters according to the other preferred embodiments of the present invention described above. In the band pass filter 100H, the first intermediate circuit MC1 is between the first filter circuit FC1 and the second filter circuit FC2. Moreover, the first intermediate circuit MC1 is electromagnetically coupled to each of the first filter circuit FC1 and the second filter circuit FC2.

Figure 16:
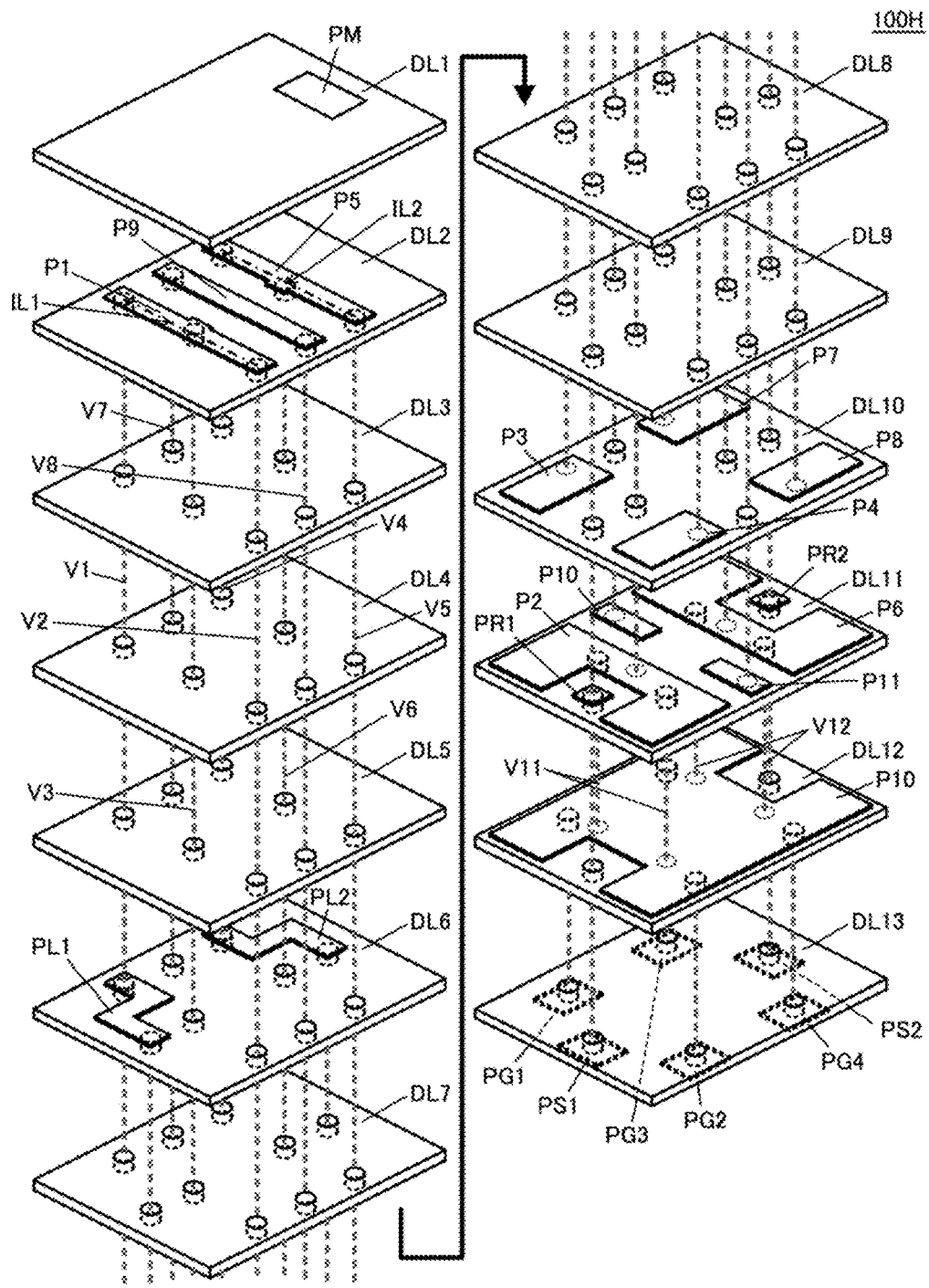
FIG. 16 is an exploded perspective view of the band pass filter of FIG. 15.

FIG. 16 is an exploded perspective view of the band pass filter 100H. The band pass filter 100H includes the laminated dielectric layers DL1 to DL13, the first filter circuit and the second filter circuit, and the first intermediate circuit. Although not explicitly illustrated in FIG. 16, the first filter circuit, the second filter circuit, and the first intermediate circuit are the same or substantially the same as those described in the equivalent circuit diagram of the band pass filter 100H of FIG. 15.

The first filter circuit and the second filter circuit are side by side in the direction perpendicular to the lamination direction of the dielectric layers DL1 to DL13. The first intermediate circuit is between the first filter circuit and the second filter circuit side by side therewith. Moreover, the first intermediate circuit is electromagnetically coupled to each of the first filter circuit and the second filter circuit.

The center of the ground via conductor V3 in the first filter circuit is located at a position shifted toward the first intermediate circuit from the virtual line IL1 that connects the center of the first via conductor V1 and the center of the second via conductor V2 to each other. Moreover, the center of the ground via conductor V6 in the second filter circuit is located at a position shifted toward the first intermediate circuit from the virtual line IL2 that connects the center of the first via conductor V4 and the center of the second via conductor V5 to each other.

It has been confirmed that, when a single intermediate circuit is provided as described above, the arrangement of each of the ground via conductors, which is provided so that the center thereof is shifted from the virtual line, makes it possible to generate each of the attenuation poles with a required amount of attenuation on the low frequency side of the pass band while maintaining the pass band.

Fourth Preferred Embodiment of Band Pass Filter

In each of the first preferred embodiment and the second preferred embodiment, the band pass filter including two intermediate circuits has been described, and in the third preferred embodiment, the band pass filter including one intermediate circuit has been described. The number of intermediate circuits included in the band pass filter according to each of the preferred embodiments may be three or more. In a fourth preferred embodiment, a band pass filter including three intermediate circuits will be described.

A band pass filter according to a fourth preferred embodiment of the present invention has the same or substantially the same characteristics as those of the second preferred embodiment. The band pass filter will be described with reference to FIG. 17.

Figure 17:
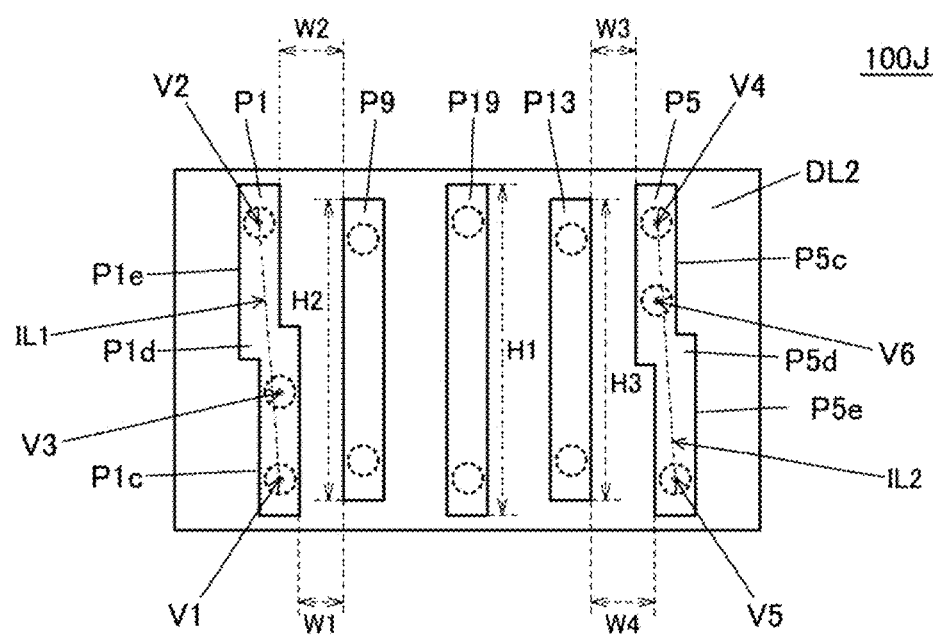
FIG. 17 is a plan view of a portion of a band pass filter that is an example of a fourth preferred embodiment of the present invention.

FIG. 17 is a plan view of a portion of a band pass filter 100J that is an example of the fourth preferred embodiment. A configuration of the band pass filter 100J is a configuration in which the band pass filter 100B illustrated in FIGS. 7 and 8 includes a third intermediate circuit that is electromagnetically coupled to each of the first intermediate circuit and the second intermediate circuit. Specifically, a dielectric layer DL2, first line electrodes P1 and P5, and second line electrodes P9 and P13, which are shown in FIG. 17, correspond to the dielectric layer DL2, the first line electrodes P1 and P5, and the second line electrodes P9 and P13, which are shown in FIG. 8, respectively. Moreover, a second line electrode P19 included in the third intermediate circuit is added to the dielectric layer DL2 in FIG. 8.

In the band pass filter 100J, the first line electrode P1 in the first filter circuit includes portions P1c to P1e. Each of the portions P1c and P1e extends in a longitudinal direction of the second line electrode P9. The portion P1d extends in a direction perpendicular or substantially perpendicular to the longitudinal direction. The portion P1c is connected to one end of portion P1d. The portion P1e is connected to the other end of the portion P1d. The first line electrode P1 is bent at a connecting portion between the portions P1c and P1d and at a connecting portion between the portions P1e and P1d. In such an extending direction of the portion P1d, a distance W1 between the portion P1c and the second line electrode P9 is shorter than a distance W2 between the portion P1e and the second line electrode P9. Note that the distance W1 may be longer than the distance W2.

The first via conductor V1 is connected to the portion P1c. The second via conductor V2 is connected to the portion P1e. The ground via conductor V3 is connected to the portion P1c. A distance between the first via conductor V1 and the ground via conductor V3 is shorter than a distance between the second via conductor V2 and the ground via conductor V3. The ground via conductor V3 may be connected to the portion P1d, or may be connected to the portion P1e. Then, the center of the ground via conductor V3 in the first filter circuit is located at a position shifted toward the first intermediate circuit from the virtual line IL1 that connects the center of the first via conductor V1 and the center of the second via conductor V2 to each other. Moreover, as described above, the ground via conductor V3 is provided in the portion P1c, which is closer to the intermediate circuit.

The first line electrode P5 in the second filter circuit includes portions P5c to P5e. Each of the portions P5c and P5e extends in a longitudinal direction of the second line electrode P13. The portion P5d extends in a direction perpendicular or substantially perpendicular to the longitudinal direction. The portion P5c is connected to one end of portion P5d. The portion P5e is connected to the other end of the portion P5d. The first line electrode P5 is bent at a connecting portion between the portions P5c and P5d and at a connecting portion between the portions P5e and P5d. In such an extending direction of the portion P5d, a distance W3 between the portion P5c and the second line electrode P13 is shorter than a distance W4 between the portion P5e and the second line electrode P13. Note that the distance W3 may be longer than the distance W4.

The first via conductor V4 is connected to the portion P5c. The second via conductor V5 is connected to the portion P5e. The ground via conductor V6 is connected to the portion P5c. A distance between the first via conductor V4 and the ground via conductor V6 is shorter than a distance between the second via conductor V5 and the ground via conductor V6. The ground via conductor V6 may be connected to the portion P5d, or may be connected to the portion P5e. Then, the center of the ground via conductor V6 in the second filter circuit is located at a position shifted toward the second intermediate circuit from the virtual line IL2 that connects the center of the first via conductor V4 and the center of the second via conductor V5 to each other. Moreover, as described above, the ground via conductor V6 is provided in the portion P5c, which is closer to the intermediate circuit.

The second line electrode P19 is between the second line electrodes P9 and P13, and extends in a longitudinal direction of the second line electrodes P9 and P13. A length H1 of the second line electrode P19 is longer than a length H2 of the second line electrode P9, and longer than a length H3 of the second line electrode P13. The length H1 may be shorter than the length H2, or may be shorter than the length H3.

It has been confirmed that, as described above, also with the band pass filter according to the fourth preferred embodiment, the arrangement of the ground via conductors, which is performed so that the center of each thereof is shifted from the virtual line, generates each of the attenuation poles with a required amount of attenuation on the low frequency side of the pass band while maintaining the pass band.

The preferred embodiments of the present invention described herein are illustrative. The present invention is not limited to the above-described preferred embodiments and the modified examples, and includes a variety of applications and modifications within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
    a first filter circuit including a first resonant circuit including a first inductor, a third inductor and a first capacitor, and a second resonant circuit including a second inductor, the third inductor and a second capacitor;
    a second filter circuit including a third resonant circuit including a fourth inductor, a sixth inductor and a third capacitor, and a fourth resonant circuit including a fifth inductor, the sixth inductor and a fourth capacitor;
    a first intermediate circuit including a fifth capacitor connected to ground, a sixth capacitor connected to the ground, and a seventh inductor connected between the fifth capacitor and the sixth capacitor;
    a second intermediate circuit including a seventh capacitor connected to the ground, an eighth capacitor connected to the ground and an eighth inductor connected between the seventh capacitor and the eighth capacitor; and
    a ninth capacitor; wherein
    the seventh inductor is electromagnetically coupled to each of the first, second, and third inductors, and the eighth inductor is electromagnetically coupled to each of the fourth, fifth, sixth, and seventh inductors; and
    the ninth capacitor is connected between the first intermediate circuit and the second intermediate circuit.

2. The band pass filter according to claim 1, wherein the ninth capacitor is connected between a connection point between the fifth capacitor and the seventh inductor and a connection point between the seventh capacitor and the eighth inductor.

3. The band pass filter according to claim 2, further comprising:
    a tenth capacitor; wherein
    the tenth capacitor is connected between a connection point between the sixth capacitor and the seventh inductor and a connection point between the eighth capacitor and the eighth inductor.

4. A band pass filter comprising:
    a plurality of dielectric layers laminated on one another;
    a first filter circuit and a second filter circuit, which are side by side in a direction perpendicular or substantially perpendicular to a lamination direction of the plurality of dielectric layers;
    a first intermediate circuit electromagnetically coupled to the first filter circuit, and a second intermediate circuit electromagnetically coupled to each of the second filter circuit and the first intermediate circuit, the first intermediate circuit and the second intermediate circuit being side by side between the first filter circuit and the second filter circuit; and
    a first intermediate capacitor electrode; wherein
    each of the first filter circuit and the second filter circuit includes:
        a first line electrode that extends in a direction perpendicular or substantially perpendicular to the lamination direction;
        a first ground electrode;
        a first capacitor electrode that faces the first ground electrode;
        a second capacitor electrode that faces the first ground electrode;
        a first via conductor that extends in the lamination direction and connects the first line electrode and the first capacitor electrode to each other;
        a second via conductor that extends in the lamination direction and connects the first line electrode and the second capacitor electrode to each other; and
        a ground via conductor between the first via conductor and the second via conductor, extends in the lamination direction, and connects the first line electrode and the first ground electrode to each other;
    each of the first intermediate circuit and the second intermediate circuit includes:
        a second line electrode that extends in the perpendicular or substantially perpendicular direction;
        a second ground electrode;
        a third capacitor electrode that faces the second ground electrode;

a fourth capacitor electrode that faces the second ground electrode;
a third via electrode that extends in the lamination direction and connects the second line electrode and the third capacitor electrode to each other; and
a fourth via electrode that extends in the lamination direction and connects the second line electrode and the fourth capacitor electrode to each other; and
the first intermediate capacitor electrode faces the third capacitor electrode of the first intermediate circuit and the third capacitor electrode of the second intermediate circuit.

5. The band pass filter according to claim 4, further comprising:
a second intermediate capacitor electrode; wherein
the second intermediate capacitor electrode faces the fourth capacitor electrode of the first intermediate circuit and the fourth capacitor electrode of the second intermediate circuit.

6. The band pass filter according to claim 4, further comprising:
a third ground electrode;
a fifth via conductor;
a sixth via conductor; and
a seventh via conductor; wherein
the first ground electrode and the second ground electrode are spaced apart from each other;
the first ground electrode in the first filter circuit and the third ground electrode are connected to each other by the fifth via conductor;
the first ground electrode in the second filter circuit and the third ground electrode are connected to each other by the sixth via conductor; and
the second ground electrode and the third ground electrode in the first and second intermediate circuits are connected to each other by the seventh via conductor.

7. A band pass filter comprising:
a plurality of dielectric layers laminated on one another;
a first filter circuit and a second filter circuit, which are side by side in a direction perpendicular or substantially perpendicular to a lamination direction of the plurality of dielectric layers; and
at least one intermediate circuit between the first filter circuit and the second filter circuit, and electromagnetically coupled to each of the first filter circuit and the second filter circuit; wherein
each of the first filter circuit and the second filter circuit includes:
a first line electrode that extends in a direction perpendicular or substantially perpendicular to the lamination direction;
a first ground electrode;
a first capacitor electrode that faces the first ground electrode;
a second capacitor electrode that faces the first ground electrode;
a first via conductor that extends in the lamination direction and connects the first line electrode and the first capacitor electrode to each other;
a second via conductor that extends in the lamination direction and connects the first line electrode and the second capacitor electrode to each other; and
a ground via conductor that is between the first via conductor and the second via conductor, extends in the lamination direction, and connects the first line electrode and the first ground electrode to each other;
the at least one intermediate circuit includes:
a second line electrode that extends in the perpendicular or substantially perpendicular direction;
a second ground electrode;
a third capacitor electrode that faces the second ground electrode;
a fourth capacitor electrode that faces the second ground electrode;
a third via electrode that extends in the lamination direction and connects the second line electrode and the third capacitor electrode to each other; and
a fourth via electrode that extends in the lamination direction and connects the second line electrode and the fourth capacitor electrode to each other; and
a center of the ground via conductor is located at a position shifted from a virtual line that connects a center of the first via conductor and a center of the second via conductor to each other.

8. The band pass filter according to claim 7, wherein
the at least one intermediate circuit includes a first intermediate circuit electromagnetically coupled to the first filter circuit, and a second intermediate circuit electromagnetically coupled to each of the second filter circuit and the first intermediate circuit; and
the first intermediate circuit and the second intermediate circuit are side by side between the first filter circuit and the second filter circuit.

9. The band pass filter according to claim 8, wherein
a center of the ground via conductor in the first filter circuit is located at a position shifted toward the first intermediate circuit from a virtual line that connects a center of the first via conductor and a center of the second via conductor in the first filter circuit to each other; and
a center of the ground via conductor in the second filter circuit is located at a position shifted toward the second intermediate circuit from a virtual line that connects a center of the first via conductor and a center of the second via conductor in the second filter circuit to each other.

10. The band pass filter according to claim 9, wherein
the first line electrode includes a first portion and a second portion that protrudes from the first portion toward the first intermediate circuit; and
the ground via conductor is connected to both of the first portion and the second portion.

11. The band pass filter according to claim 8, further comprising:
a third ground electrode;
a fifth via conductor;
a sixth via conductor; and
a seventh via conductor; wherein
the first ground electrode and the second ground electrode are spaced apart from each other;
the first ground electrode in the first filter circuit and the third ground electrode are connected to each other by the fifth via conductor;
the first ground electrode in the second filter circuit and the third ground electrode are connected to each other by the sixth via conductor; and
the second ground electrode and the third ground electrode in the first and second intermediate circuits are connected to each other by the seventh via conductor.

12. The band pass filter according to claim 8, further comprising:
a first intermediate capacitor electrode; wherein the first intermediate capacitor electrode faces the third capacitor electrode of the first intermediate circuit and the third capacitor electrode of the second intermediate circuit.

13. The band pass filter according to claim 12, further comprising:
a second intermediate capacitor electrode; wherein
the second intermediate capacitor electrode faces the fourth capacitor electrode of the first intermediate circuit and the fourth capacitor electrode of the second intermediate circuit.

14. The band pass filter according to claim 7, wherein the at least one intermediate circuit includes a first intermediate circuit between the first filter circuit and the second filter circuit and is electromagnetically coupled to each of the first filter circuit and the second filter circuit.

15. The band pass filter according to claim 7, wherein
the at least one intermediate circuit includes a first intermediate circuit electromagnetically coupled to the first filter circuit, a second intermediate circuit electromagnetically coupled to the second filter circuit, and a third intermediate circuit electromagnetically coupled to each of the first intermediate circuit and the second intermediate circuit; and
the first intermediate circuit, the second intermediate circuit and the third intermediate circuit are side by side between the first filter circuit and the second filter circuit.

* * * * *